United States Patent
Liu et al.

(10) Patent No.: US 7,235,992 B2
(45) Date of Patent: Jun. 26, 2007

(54) SEMICONDUCTOR FACILITY

(75) Inventors: Yu-Hsin Liu, Hsinchu (TW); Te-Hsing Chiang, Miaoli County (TW); Yu-Shu Chen, Hsinchu County (JP)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 11/146,008

(22) Filed: Jun. 7, 2005

(65) Prior Publication Data

US 2005/0270050 A1    Dec. 8, 2005

(30) Foreign Application Priority Data

Jun. 8, 2004    (TW) .............................. 93116404 A

(51) Int. Cl.
*G01R 31/02* (2006.01)

(52) U.S. Cl. .................................................... 324/760

(58) Field of Classification Search ................ 324/760, 324/765, 158.1; 361/234–235; 257/48
See application file for complete search history.

(56) References Cited

U.S. PATENT DOCUMENTS

| 6,552,561 | B2 * | 4/2003 | Olsen et al. ................. 324/760 |
| 6,711,961 | B2 * | 3/2004 | Theriault et al. ........... 73/865.6 |
| 6,891,385 | B2 * | 5/2005 | Miller ......................... 324/760 |
| 2002/0050834 | A1 * | 5/2002 | Olsen et al. ................. 324/760 |

* cited by examiner

*Primary Examiner*—Ha Tran Nguyen
*Assistant Examiner*—Tung X. Nguyen
(74) *Attorney, Agent, or Firm*—Birch, Stewart, Kolasch, & Birch, LLP

(57) ABSTRACT

A semiconductor facility. The semiconductor facility comprises a printed circuit board (PCB), a heat source, and an adjusting device. The PCB comprises a first surface and a second surface. The heat source provides heat for a first fluid around the PCB to steadily heat up the PCB. The temperature of the first surface is adjusted to be lower than that of the second surface by the adjusting device such that the PCB is rapidly deformed to a stable state.

7 Claims, 7 Drawing Sheets

SEMICONDUCTOR FACILITY

BACKGROUND

The invention relates to a semiconductor facility, and in particular to a wafer probe.

FIG. 1a is a schematic view of a test head 100 of a conventional wafer probe. As shown in FIG. 1a, the test head 100 comprises a body 130, a first restricting element 121, a second restricting element 122, a printed circuit board (PCB) 110, a clamping element 140, and a probe head 170. The first restricting element 121 and the second restricting element 122 clamp the PCB 110 to restrict deformation of the PCB 110. A connecting portion 131 and the PCB 110 are fixed together via a positioning portion 124 such as a zero insertion force socket (ZIF). The test head body 130 connects to the PCB 110 by the connecting portion 131. The clamping portion 140 clamps the PCB 110. The probe head 170 is connected to the PCB 110 with probe pins 171 thereon. A wafer carrier 160 is disposed under the test head 100.

FIG. 1b is a schematic view when the test head 100 is testing a wafer 150. When the wafer 150 is disposed on the wafer carrier 160, during probing, the test head 100 moves down and an end of each probe pin 171 is inserted into the wafer 150 such that the test head 100 begins examining the wafer 150.

FIG. 2a is a schematic view of the PCB 110 and the probe head 170 when the wafer probe is idle. At this time, the PCB 110 and the probe head 170 are not deformed. Please also refer to FIGS. 1b and 2b, when the wafer probe begins, the wafer carrier 160 produces heat on the PCB 110 and the probe head 170 such that the PCB 110 and the probe head 170 is pre-heated. During the pre-heating procedure, heat is transferred from the wafer carrier 160 to the PCB 110 and the probe head 170 such that upper surfaces of the PCB 110 and the probe head 170 have higher temperature than the lower surfaces. The PCB 110 and the probe head 170 deform downward due to thermal expansion and contraction. As shown in FIG. 2c, after a period of pre-heat time, since heat is accumulated to a certain level, the PCB 110 and the probe head 170 are turned out to curve upward to reach a stable state. In the deformation process mentioned above, the deformation of the PCB 110 and the probe head 170 is leading by the deformation of the PCB 110, because the volume of the PCB 110 is greater than that of the probe head 170.

Additionally, as shown in FIG. 3a, the wafer 150 has a plurality of probe marks 151 for insertion of probe pins 171 and testing the wafer 150. FIGS. 3b, 3c and 3d show relations between the probe pins 171 and the probe marks 151. With reference to FIG. 3b, when the pre-heat procedure is not applied, some probe pins 171 dislocate from the probe marks 151 for compensating the following deformation. Then, with reference to FIG. 3c, when preheat procedure is applied, the probe head 170 deforms downward, and some probe pins 171 dislocate from the probe marks 151. Finally, when the probe head 170 curves upward, ends of the probe pins 171 are aiming at the probe marks 151.

The PCB 110 and the probe head 170, however, achieve the stable state in FIGS. 2c and 3d after a period of time. Thus, the testing time is longer.

SUMMARY

Embodiments of the invention provide a semiconductor facility to eliminate the shortcomings described above.

Also provided is a semiconductor facility comprising a printed circuit board (PCB), a heat source, and an adjusting device. The PCB comprises a first surface and a second surface. The heat source provides heat for a first fluid around the PCB to steadily heat up the PCB. The temperature of the first surface is adjusted lower than that of the second surface by the adjusting device such that the PCB is deformed rapidly to a stable state.

The invention controls surface temperature of the first surface and the second surface of the PCB such that the PCB is deformed quickly to a stable state with a short preheat time.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the subsequent detailed description and the accompanying drawings, which are given by way of illustration only, and thus are not limitative of the present invention, and wherein.

DETAILED DESCRIPTION

Figure 1A:
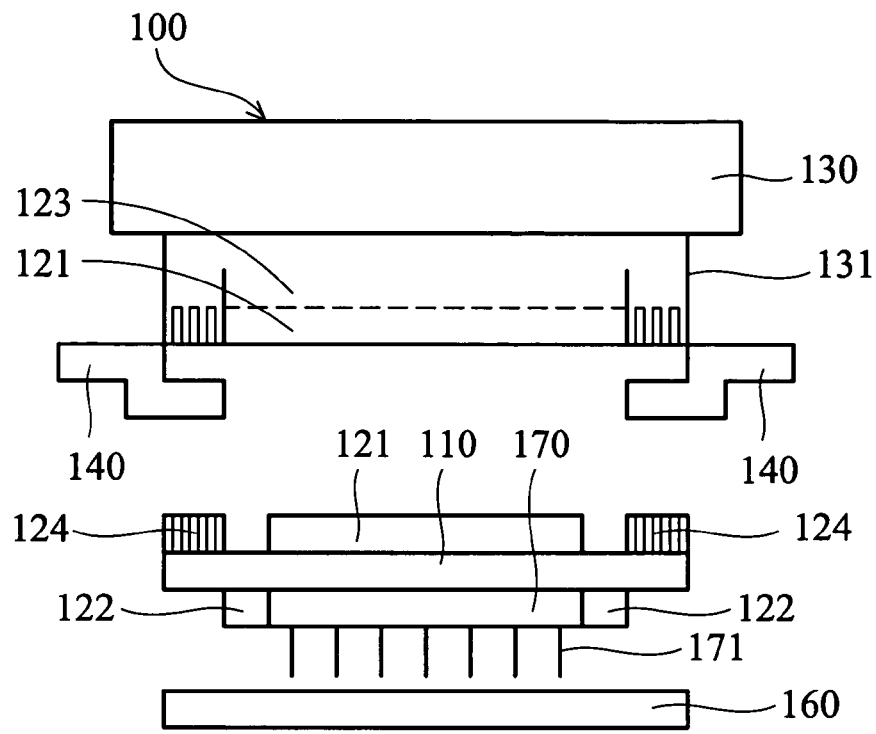
FIG. 1a is a schematic view of a test head of a conventional wafer probe.
Figure 1B:
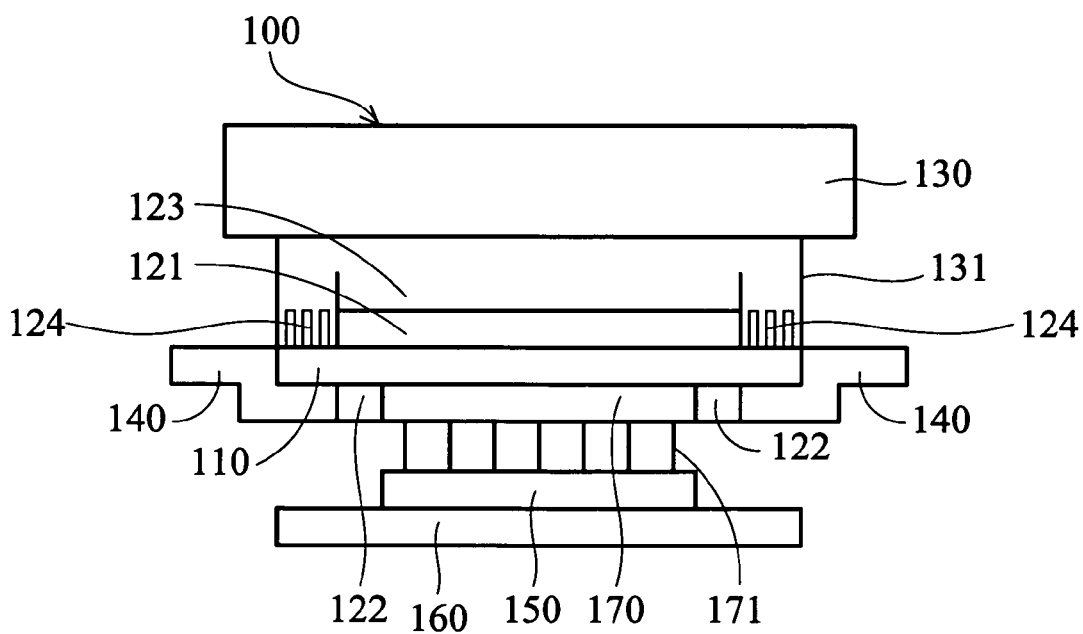
FIG. 1b is a schematic view when the conventional test head is testing a wafer.
Figure 2A:
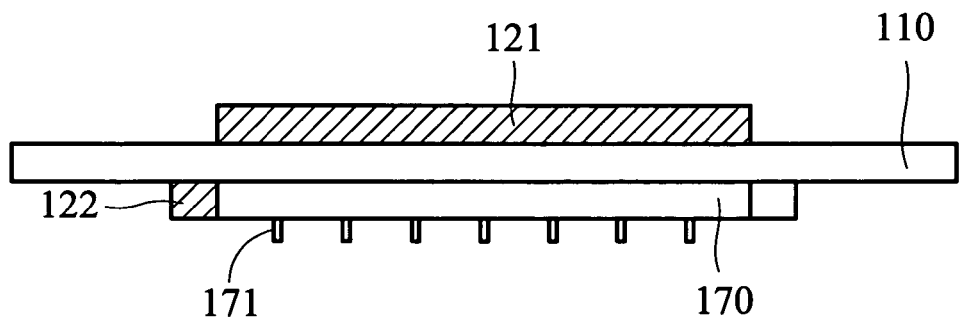
FIG. 2a is a schematic view of an initial state of the conventional PCB and probe head when a wafer probe is idle.
Figure 2B:
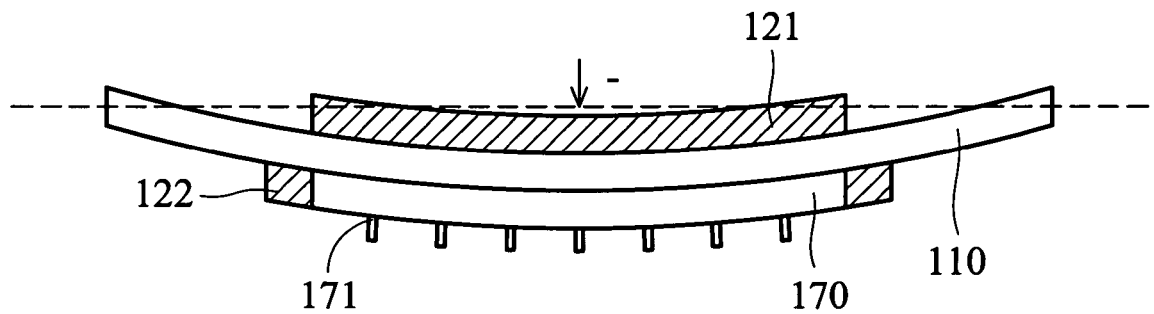
FIG. 2b is a schematic view showing deformation of the conventional PCB and probe head when preheated.
Figure 2C:
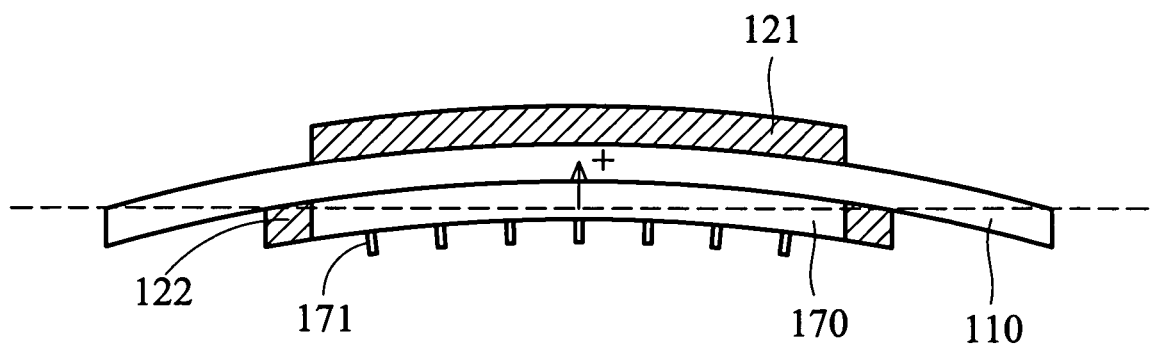
FIG. 2c is a schematic view of the conventional PCB and probe head in a stable state.
Figure 3A:
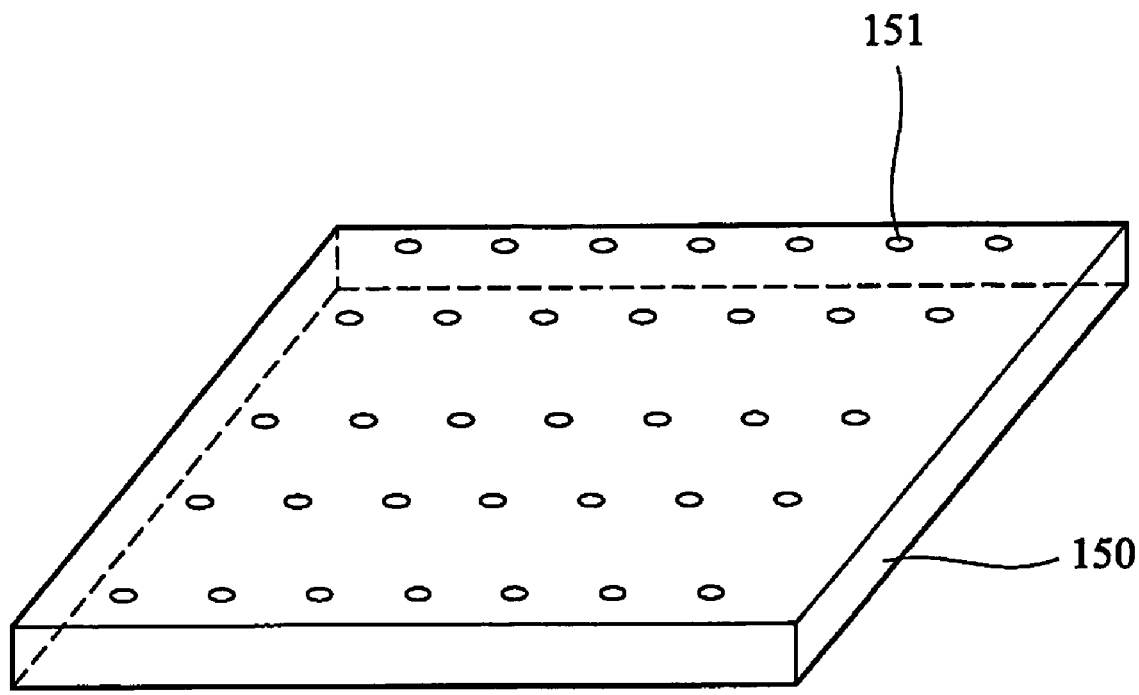
FIG. 3a is a schematic view showing probe marks on a surface of the wafer.
Figure 3B:
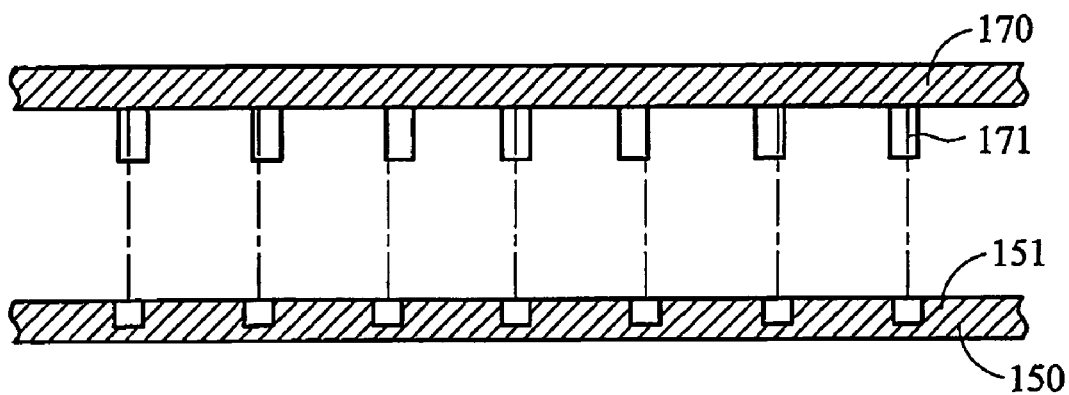
FIG. 3b shows the PCB, the probe head and the probe marks when no pre-heat is applied.
Figure 3C:
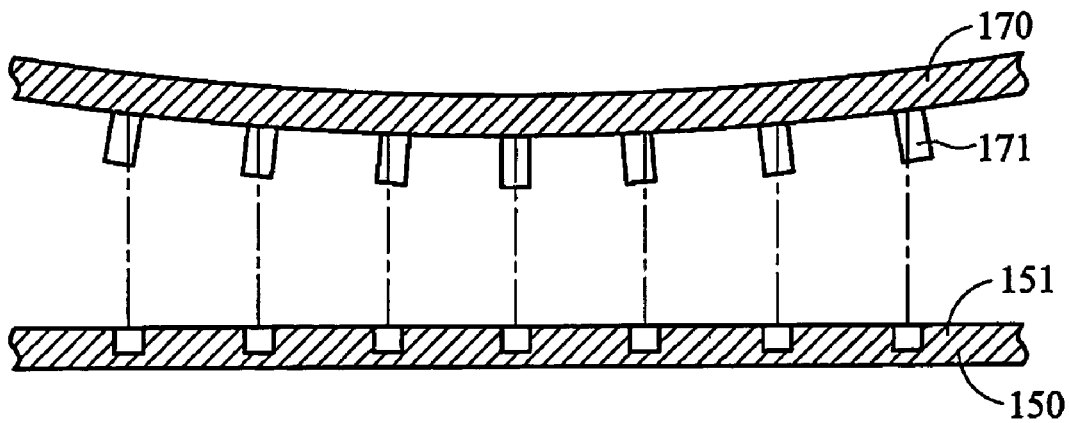
FIG. 3c shows the PCB, the probe head and the probe marks when the PCB and probe head deforms downward.
Figure 3D:
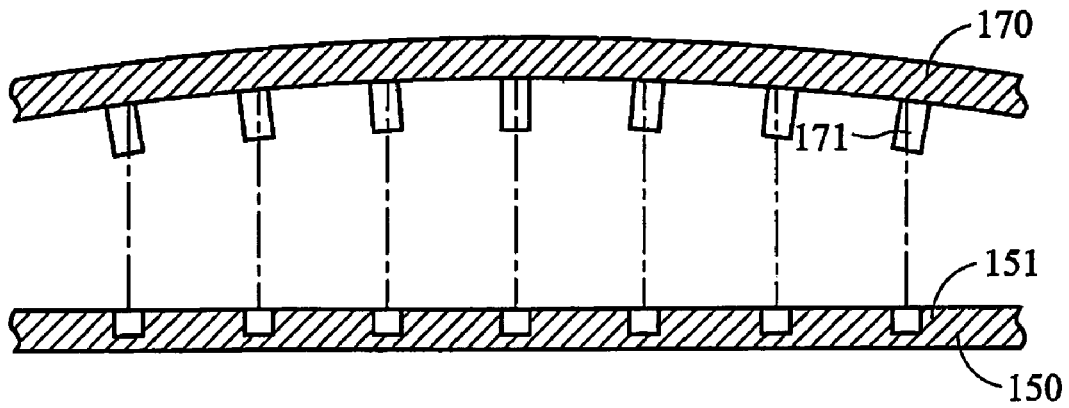
FIG. 3d shows the PCB, the probe head and the probe marks when the PCB and probe head deforms upward.
Figure 4:
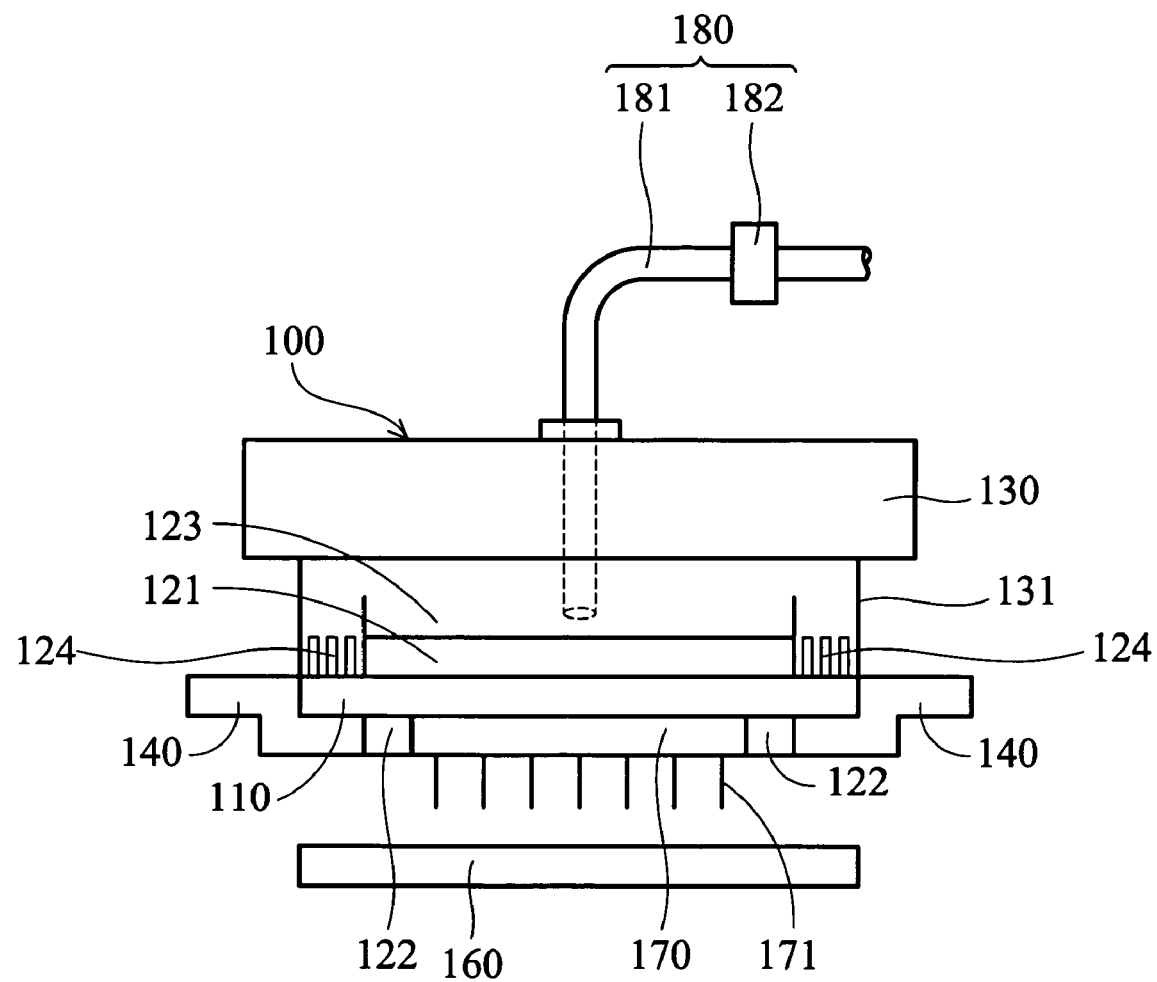
FIG. 4 is a schematic view of a semiconductor facility of the invention.

FIG. 4 is a schematic view of a semiconductor facility of the invention, comprising a test head 100 and a wafer carrier 160. The test head 100 comprises a body 130, a first restricting element 121, a second restricting element 122, a printed circuit board (PCB) 110, a clamping element 140, a probe head 170, and an adjusting device 180. The first restricting element 121 and the second restricting element 122 are clamped on the PCB 110 to restrict deformation. A connecting portion 131 and the PCB 110 are fixed together via a positioning portion 124 such as a zero insertion force socket (ZIF). The test head body 130 connects to the PCB 110 by the connecting portion 131. The adjusting device 180 extends to the body 130, and airflow is guided to the first restricting element 121 by a heat-dissipating portion 123 to adjust surface temperature of the PCB 110 and the first restricting element 121. The clamping portion 140 clamps the PCB 110. The probe head 170 is connected to the PCB 110 with probe pins 171 thereon. A wafer carrier 160, a heat source, is disposed under the test head 100 to heat the PCB 110 and the probe head 170.

Figure 5A:
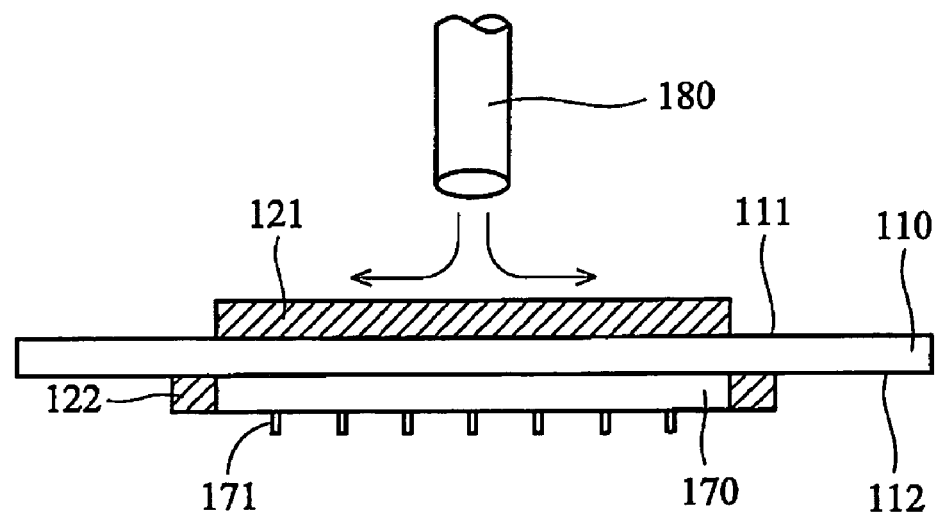
FIGS. 5a to 5b are schematic views showing deformation of the PCB when a test head is preheated.
Figure 5B:
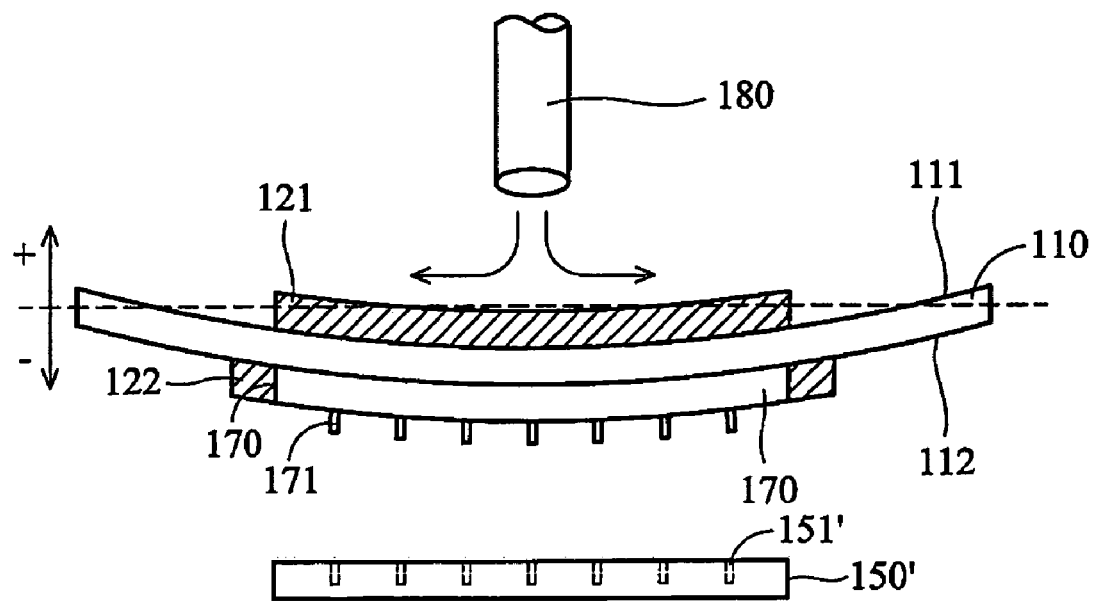

FIGS. 5a to 5b are schematic views showing deformation of the PCB 110 when the test head 100 is preheated. As shown, the PCB 110 comprises a first surface 111 and a second surface 112. The first restricting element 121 contacts the first surface 111, and the second restricting element 122 contacts the second surface 112. The adjusting device 180 blows gas toward the first restricting element 121 to adjust the temperature of the first restricting element 121 and the first surface 111 such that the temperature of the first surface 111 is lower than that of the second surface 112. Thus, the PCB 110 is rapidly deformed to reach a stable state. FIG. 5a shows that the PCB 110 without deformation, and FIG. 5b shows that the PCB 110 is in a stable state, as opposed to the conventional design. That is, the PCB 110 deforms downward when it is stable. When the PCB 110 is in the stable state in FIG. 5b, ends of the probe pins 171 are aiming at the probe marks 151' on wafer 150'.

The adjusting device 180 blows gas to the first restricting element 121 to adjust the surface temperature of the PCB 110, and comprises a tube 181 and an adjusting valve 182. The adjusting valve 182 controls flow volume such that the gas blows at the first restricting element 121 at a pressure between 0.1 and 0.2 MPa. The gas can be air or other gas. Temperature can be modified according different operating environments. A preferable temperature range is between 25° C. to 90° C., or especially at 80° C.

Figure 6:
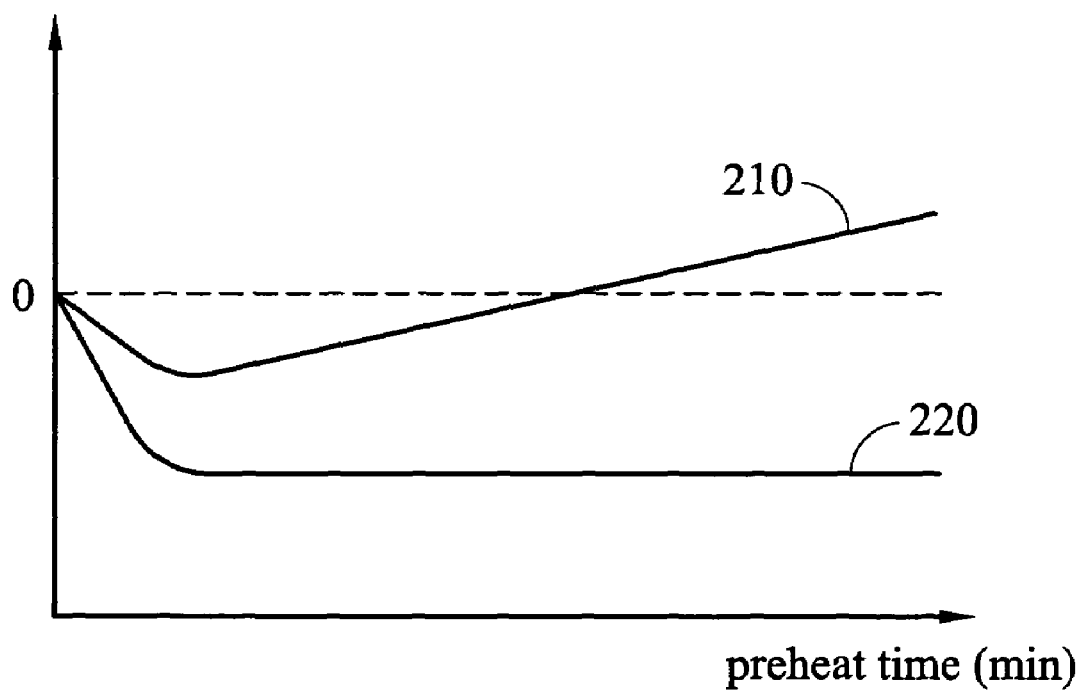
FIG. 6 is a plot showing variation of center point position between the conventional PCB and the PCB of the invention.

FIG. 6 is a plot showing variation of center point position between the conventional PCB and the PCB of the invention. The curve 210 represents variation of the center point position of the PCB 110 when heated in a conventional design. A positive value shows that the PCB 110 is curved upward. A negative value shows that the PCB 110 is curved downward. It can be seen from the curve 210 that the distance of the center point of the conventional PCB 110 with respect to its initial position changes from a negative value to a positive value. That is, the conventional PCB 110 deforms downward and upward. Thus, preheat time is lengthened. The curve 220 represents variation of the center point position of the PCB 110 of the invention when heated. It can be observed from the curve 220 that the distance between the initial position and the center point of the PCB of the invention remains negative. That is, the PCB 110 of the invention only deforms downward until it reaches a stable state.

The invention controls surface temperature of the first surface and second surface of the PCB such that the PCB rapidly reaches a stable state, thereby shortening preheat time and increasing testing speed.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor facility, comprising:
    a printed circuit board, comprising a first surface and a second surface;
    a heat source, providing heat to the printed circuit board to heat up the printed circuit board;
    an adjusting device, controlling temperature of the first surface such that the temperature of the first surface is lower than the temperature of the second surface;
    a first restricting element;
    a second restricting element, wherein the first and second restricting elements clamping the first surface and the second surface, respectively, to restrict deformation of the printed circuit board;
    wherein the adjusting device blows a fluid toward the first restricting element to adjust the temperature of the first restricting element and the first surface.

2. The semiconductor facility as claimed in claim 1, wherein the temperature of the fluid is between 25° C. and 90° C.

3. The semiconductor facility as claimed in claim 2, wherein the temperature of the fluid is 80° C.

4. The semiconductor facility as claimed in claim 1, wherein the fluid blows at the first restricting clement at a pressure between 0.1 and 0.2 Mpa.

5. The semiconductor facility as claimed in claim 1, wherein the heat source comprises a wafer carrier.

6. The semiconductor facility as claimed in claim 1, further comprising a test head body, disposed above the printed circuit board.

7. The semiconductor facility as claimed in claim 1, further comprising a clamping element, clamping the printed circuit board.

* * * * *